United States Patent [19]

Eumurian et al.

[11] Patent Number: 4,605,899
[45] Date of Patent: Aug. 12, 1986

[54] MAGNETIC FIELD SENSOR USING A COAXIAL LINE WOUND INTO A COIL

[75] Inventors: Grégoire Eumurian, Argenteuil; Jean-Pol Levan, Clamart, both of France

[73] Assignee: Thomson CSF, Paris, France

[21] Appl. No.: 541,004

[22] Filed: Oct. 11, 1983

[30] Foreign Application Priority Data

Oct. 15, 1982 [FR] France ................ 82 17296

[51] Int. Cl.$^4$ ............. G01R 33/02; H01F 5/02; H01F 15/04
[52] U.S. Cl. .............. 324/258; 174/35 CE; 324/260; 336/84 C; 336/200; 343/842
[58] Field of Search ........... 324/117 R, 127, 244, 324/258, 260, 72; 336/84 R, 84 C, 200, 206, 195; 343/841, 842, 700 MS; 174/35 CE; 333/243, 245

[56] References Cited

U.S. PATENT DOCUMENTS

| | | | |
|---|---|---|---|
| 1,490,382 | 4/1924 | Gokhale. | |
| 2,349,154 | 5/1944 | Finch et al. | 343/842 |
| 2,419,577 | 4/1947 | Libby | 348/842 X |
| 2,465,381 | 3/1949 | Libby | 343/842 X |
| 2,681,434 | 6/1954 | Wheeler | 343/842 X |
| 3,662,255 | 5/1972 | Garrett | 324/228 |
| 3,902,177 | 8/1975 | Mori et al. | 343/842 X |
| 3,973,263 | 8/1976 | Green | 343/842 X |
| 4,433,336 | 2/1984 | Carr | 343/842 X |

FOREIGN PATENT DOCUMENTS

| | | | |
|---|---|---|---|
| 2418468 | 9/1979 | France. | |
| 0192877 | 11/1982 | Japan | 324/260 |
| 6701915 | 8/1968 | Netherlands. | |

OTHER PUBLICATIONS

Yokoshima et al., "HF Magnetic Field Standard", IEEE Transactions on Instrumentation and Measurement, vol. IM-29, No. 4, Dec. 1980, pp. 452–454.

Duncan, Paul H., "Analysis of the Moebius Loop Magnetic Field Sensor" *IEEE Transactions on Electromagnetic Compatibility*, vol. EMC-16, No. 2, May 1974, pp. 83–89.

*Primary Examiner*—Gerard R. Strecker
*Attorney, Agent, or Firm*—Cushman, Darby & Cushman

[57] ABSTRACT

The sensor makes it possible to increase the performances, particularly from the sensitivity and frequency band standpoints, by means of a coaxial helical coil, matched to the connecting end to an auxiliary current measuring apparatus. At each turn, a portion of the external conductor is bared and equipped with elements for matching to the characteristic impedance in order to compensate the breaks caused in this way.

7 Claims, 9 Drawing Figures

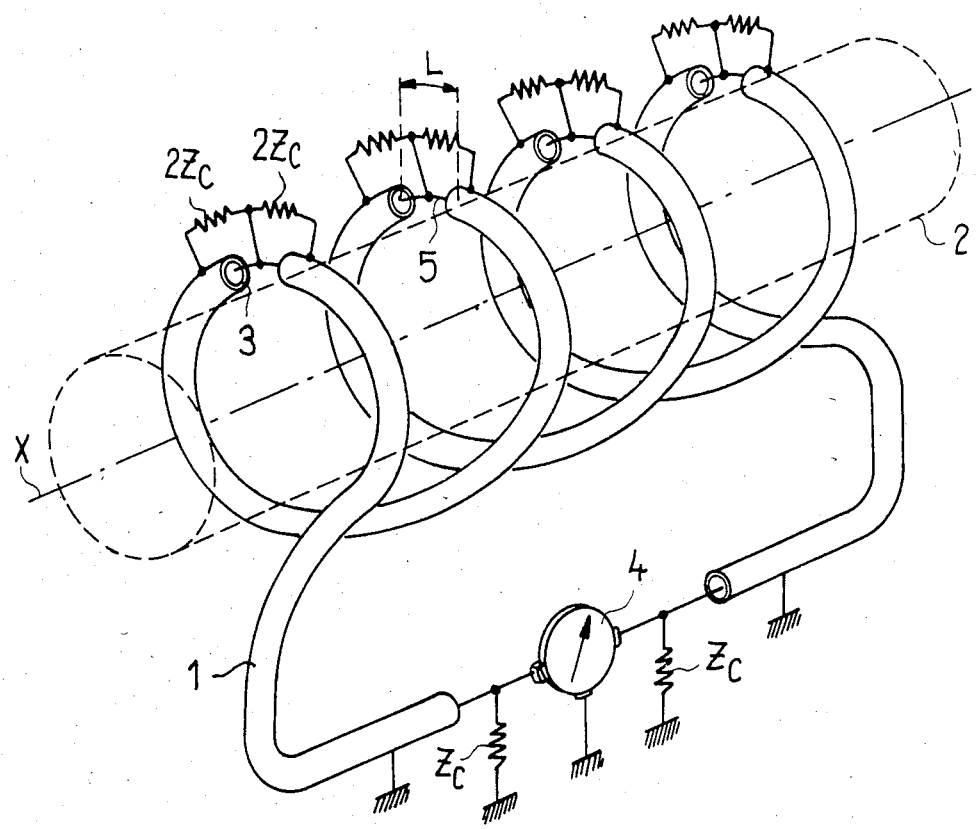
FIG_1
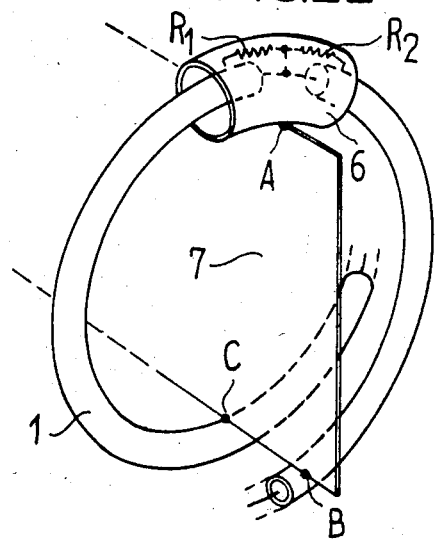
FIG_2
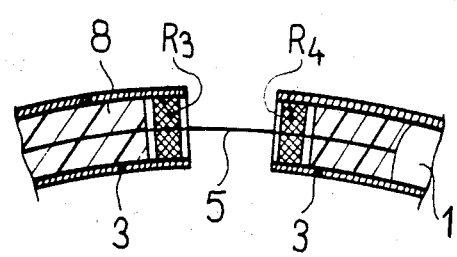
FIG_3

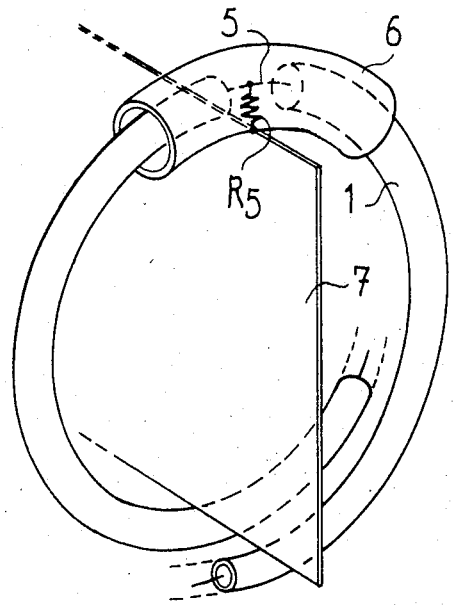
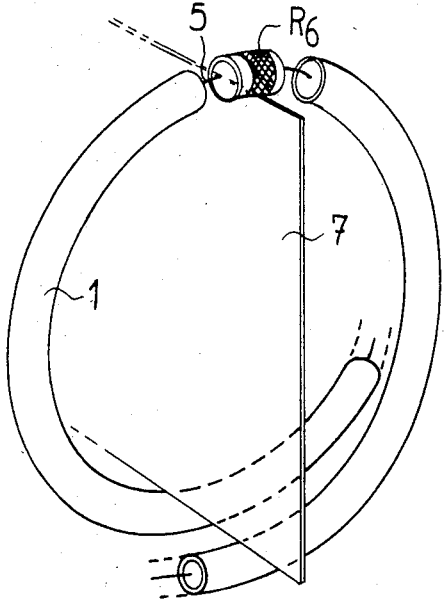
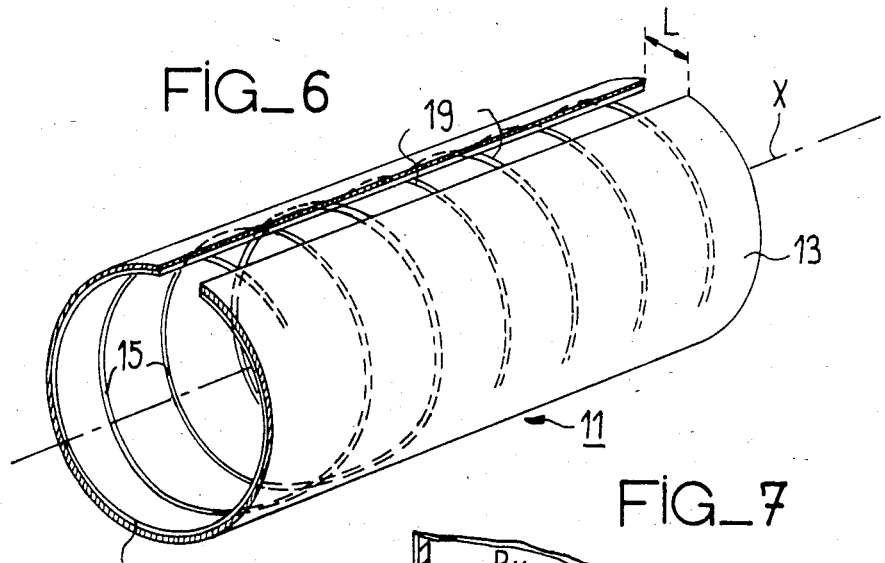
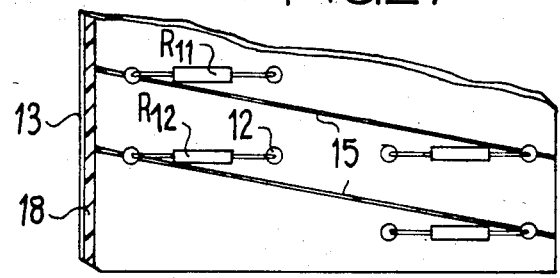

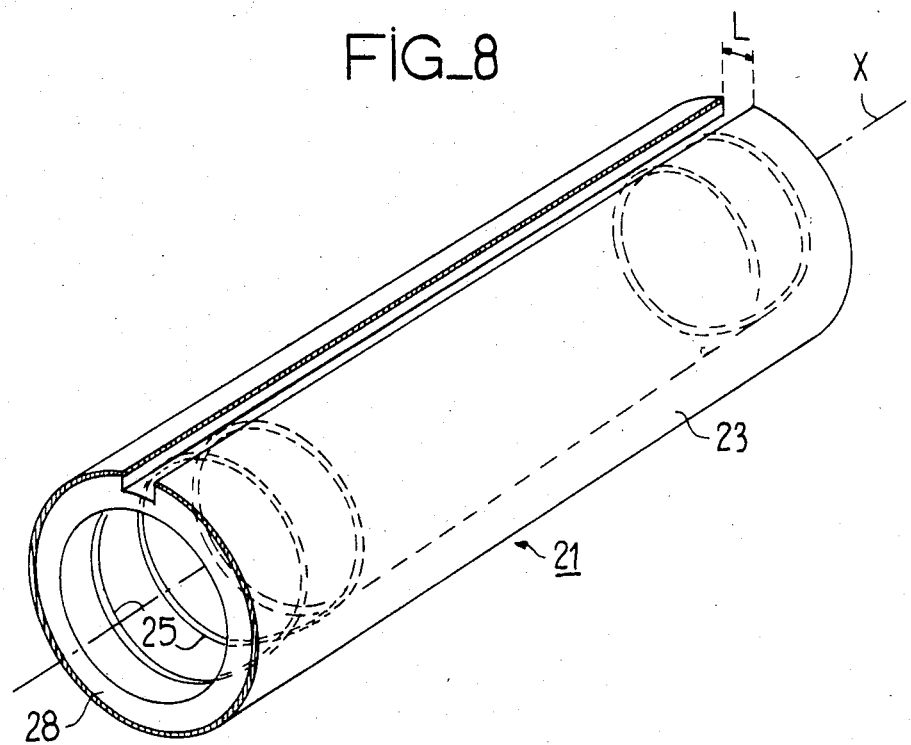
FIG_8
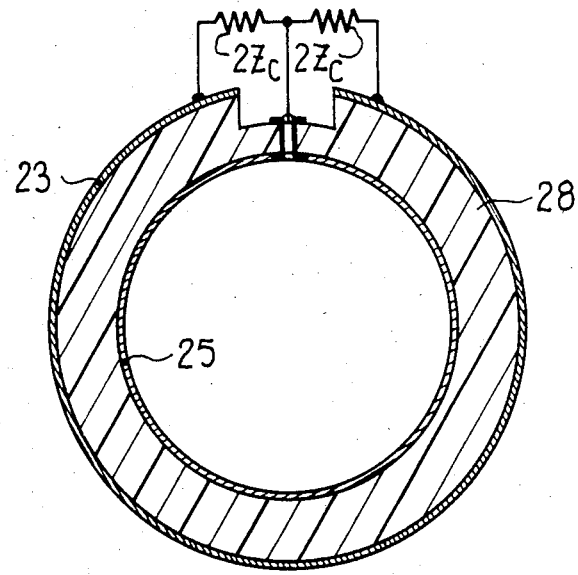
FIG_9

MAGNETIC FIELD SENSOR USING A COAXIAL LINE WOUND INTO A COIL

BACKGROUND OF THE INVENTION

The present invention relates to a broad band, high sensitivity, alternating magnetic field sensor making it possible to obtain a high-performance measuring apparatus.

The development of electromagnetic transmission has led to a widening of the frequencies, both on the low frequency side (a few dozen Hz for submarine transmissions) and on the high frequency side (several dozen gigahertz for satellite transmissions).

Most of the magnetic field sensors only cover in each case a reduced frequency range, which is a few octaves in the best of cases.

Therefore, the interest of a very wide band sensor making it possible on the one hand to replace several narrow band sensors and on the other to detect a phenomenon, whose instantaneous frequency spectrum is very broad is obvious. This type of sensor also makes it possible to study transient phenomena (interference, atmospherics, lightning, etc.), whose frequency spectrum is not always also known a priori, so that it is necessary to seek the phenomenon in the widest pass band possible.

Magnetic field measurements can be carried out with sensors using several techniques, including the Hall effect and the induction of a voltage in a conductor in accordance with the Lorenz law. Hall effect sensors are limited to frequencies of a few megahertz. However, the frequency limitation of sensors using magnetic induction only results from the construction and geometry of the sensor.

The voltage induced in a coil is proportional to the frequency of the phenomenon, the total cross-section of the coil and to the number of turns. In order to obtain a good sensitivity at low frequencies, it is therefore necessary to increase the cross-section, as well as the number of turns. However, to widen the response to high frequencies, it is necessary for the coil to have low stray capacitances and consequently a reduced number of turns, and that the dimensions of the sensor are small compared with the wavelength corresponding to the highest frequency. Moreover, in order to obtain a good rejection of the electric field E, the coil must be shielded, which increases stray capacitances and to the same extent limits the frequency response. It is therefore difficult to construct a sensor having a wide pass band and a good sensitivity at low frequencies.

The shielded frame is a known solution in the form of a shielded flat coil. The shield is slotted, so that it does not form a short-circuited loop, which would absorb virtually all the magnetic field by induced eddy currents. Such a magnetic field sensor can be optimized either for a good sensitivity at low frequencies (large diameter, large number of turns), or for a response at high frequencies (small diameter, small number of turns). The first optimization leads to a poor response at high frequencies (excessively low resonant frequency), whilst the second optimization leads to a limitation of the sensitivity at low frequencies (excessively reduced overall cross-section of the coil).

The Moebius loop is another known solution, which comprises two half-loops produced with a coaxial cable, which are connected in series by connecting the central conductor of one of them to the sheath of the other and vice versa. This arrangement has a much broader response to high frequencies than that of a conventional shielded frame. As the structure is coaxial and matched at the output, the limitation at high frequencies does not appear, provided that the wavelength remains much higher than the diameter. The sensitivity at low frequencies corresponds to that of a frame with the same dimensions and having two coils.

Thus, neither of the two known devices makes it possible to obtain both a broad frequency response and a good sensitivity at low frequencies.

SUMMARY OF THE INVENTION

The object of the present invention is to obviate these disadvantages and limitations of the known solutions, whilst providing a better performance sensor by combining their advantages.

The proposed sensor comprises a coil produced with the aid of a line (coaxial, strip line), whose characteristic impedance is constant and known and in which the external conductor forming the shield is interrupted for each turn in order to prevent the formation of short-circuit loops. The effect of the impedance break, due to each of these external conductor discontinuities is compensated by a corresponding matching obtained by branching between internal and external conductors of a network corresponding to the characteristic impedance of the line used for the coil. The sensitivity to the electric field due to the periodic interruption of the shielding is reduced by a supplementary shield located at each discontinuity. There is a differential coil output with impedance matching at the two ends. Moreover, in order to increase the sensitivity of this sensor, whilst retaining the reduced dimensions, a magnetic core can be positioned within the coil.

The invention therefore specifically relates to a magnetic field sensor using a coaxial, constant characteristic impedance line, having a turn which is free from its external conductor over a portion of the line and with first means for matching said characteristic impedance provided at the output ends of the line for connection to an induced current measuring device, the sensor being characterized in that the line comprises a plurality of turns forming a coil, whereof each coil also has a portion free from the external conductor and each of these portions has second matching means for compensating the matching break created by these coaxial line interruptions.

BRIEF DESCRIPTION OF THE DRAWINGS

The invention is described in greater detail hereinafter relative to non-limitative embodiments and the attached drawings, wherein show:

FIG 1 a sensor according to the invention in the form of a coaxial line;

FIG. 2 a detail of the arrangement of FIG. 1 showing the matching elements and the shielding possibility;

FIGS. 3 to 5 constructional variants of the matching to the line interruptions;

FIG. 6 a sensor according to the invention in the form of a flexible printed circuit;

FIG. 7 part of the developed structure of the printed circuit according to FIG. 6;

FIG. 8 a sensor according to the invention in printed circuit form on a rigid structure; and FIG. 9 a detail of FIG. 8 showing the fitting of the matching elements.

DETAILED DESCRIPTION OF THE PREFERRED EMBODIMENTS

With reference to FIG. 1, the sensor is constructed with a coaxial, constant characteristic impedance line, which can be flexible, semi-rigid or rigid. This line has a plurality of turns and forms a helical coil. It can be obtained by winding cable 1 onto a cylindrical mandrel 2, which may or may not have a magnetic core, as a function of the sensitivity and the desired frequency response. At each turn, the external conductor 3 of the coaxial cable is interrupted over a portion of the line, so as to ensure that the shield 3 does not form a shorted turn, which would give rise to eddy currents. The bare portions are regularly positioned along the line at intervals corresponding to the length of one turn, the coil forming a regular helix around a straight cylinder and the bare portions being the lines parallel to the axis of the cylinder.

The ends of the line are matched and connected to an auxiliary alternating current measuring apparatus 4 in order to measure the current induced by the magnetic field in the sensor. By calling the characteristic impedance of the line $Z_c$ in conventional manner, said matching can take place with discrete elements and in general purely resistive elements of value $Z_c$. Other matching means are provided for each shield-free portion in order to compensate the corresponding impedance break and preserve the line matching. This can be carried out with one or more impedances, whose equivalent value is equal to the characteristic impedance $Z_c$ of the cable. In the represented embodiment, each portion has two discrete elements of value $2Z_c$ each, respectively connecting the central conductor 5 in said portion to the external shield 3 at each end of the cable leading to said portion.

In order to increase the rejection of the electric field, the portions freed by the interruption of shield 3, as well as the connected matching impedances can be locally shielded.

FIG. 2 shows a corresponding construction at the location of an area free from an external shield 3, the matching impedances R1 and R2 having a value $2Z_c$ and, with the area in question, are located within a metal sleeve 6. A metal screen or plate 7 constituting a low impedance conductor is used for connecting each of the sleeves, such as 6 to earth, i.e. to the external conductor 3. This connection cannot in fact take place to the bared portion, because a shorted turn would be reproduced with shield 6 and the adjacent conductor 3. The connection advantageously takes place with the diametrically opposite point furthest from the sleeve. Plate 6 is welded to the sleeve at A and opposite to weld points B and C to the external sheath 3 of the cable.

FIG. 3 shows in cross-section, a constructional variant of the matching using coaxial elements integrated into the structure of the line, in the form of two coaxial resistors R3, R4 each of value $2Z_c$. These known resistive elements are used for forming terminal load resistors for coaxial lines.

Other variants are possible and two of these are shown in FIGS. 4 and 5, using a single resistive element, either of a conventional nature R5, or as a coaxial structure R6. The element is connected between the central conductor 5 and earth, the latter connection taking place by the bias of the metal plate 7. Element R5 or R6 has a value $Z_c$.

In the case of median plate or screen arrangements 7, if it is wished to place a magnetic material core within coil 1, it will be necessary to divide the core into two parts, arranged on either side of said screen 7.

Reference has not been made hereinbefore to insulants 8 (FIG. 3) between conductors 3 and 5, because this insulant must be removed, otherwise it would be prejudicial to the welding of conventional resistors (FIGS. 1, 2, 4) and would not make it possible to fit coaxial resistors (FIGS. 3 and 5).

It should be noted that the sensor according to the invention can also be defined by a plurality of coaxial line elements connected end to end for linking said central conductor, each element being in the form of a turn and having a length slightly less than that of one turn, in order to provide on each occasion a line portion free from shield 3.

Other embodiments of a magnetic field sensor according to the invention can be envisaged, by using strip lines obtained according to printed circuit or similar technology.

FIGS. 6 and 7 relate to constructions with a strip line, carried by a flexible or rigid insulating support. The coil may or may not include a magnetic core, as a function of the desired sensitivity and frequency response. The external conductor of the line (Shield) is interrupted at each turn. At each corresponding impedance break, the line is matched by one or more impedances, whose equivalent value is equal to the characteristic impedance of the line. These impedances can either be constructed as discrete elements, or with the aid of a resistive paste. The bare parts of the line, following the interruption of the shield, as well as the connected impedances, can also be shielded in order to increase the rejection of the electric field.

FIG. 6 shows a sensor constructed from a wound flexible printed circuit 11. This double-faced circuit has on one face the earth plane 13 corresponding to the line shielding and on the other face a series of parallel tracks 15 which, with the earth plane, form the different segments of the strip line.

The matching impedances R11, R12, etc. are placed at the ends of the tracks and the connections with the earth plane are realised with metallized holes, such as 12. After wiring these impedances, the circuit shown partly flat in FIG. 7 is wound in order to obtain the arrangement of FIG. 6, i.e. a cylinder, but whilst providing a space L between the facing edges. Not shown securing means are provided (end clips, mandrels, etc.). The continuity of the line is ensured by connecting the ends of turns 15 to one another to form a continuous helix by means of conductor ends 19. The earth plane 13, which is on the outside, is consequently interrupted in order to prevent the formation of a shorted turn. The rejection of the electric field is improved by a screen positioned above the slot and connected to earth by an appropriate connection.

FIG. 8 shows a sensor produced from a rigid cylindrical tube 28 made from dielectric material. This tube is initially metallized by a deposit on its outer surface, as well as on its inner surface. The external metal coating will form the shielding 23 of the strip line. The interruption of this shielding to obtain the different portions of width L is obtained by machining (milling, abrasion, chemical etching, etc.). The internal deposit forms the strip 25 after machining, such as helical milling, which removes the useless metal portions.

The detailed FIG. 9 is a cross-section of the arrangement of matching impedances. These elements are located at each coil at the position of the slot corresponding to the shielding-free portions are connected to the helical strip 25 by a row of metallized holes 22 located at the slot. The matching impedances can either be discrete impedances between the metallized holes and the shielding, or a resistive paste deposit applied by sand blasting, laser. etc.

A screen placed above the slot and connected to earth by an appropriate connection improves the rejection of the electric field.

What is claimed is:

1. A magnetic field sensor comprising:
   a coaxial, constant characteristic impedance line having an internal conductor and an external conductor, said characteristic impedance being resistive, said line being terminated at two ends and being formed into a plurality of turns constituting a coil with each turn having a portion wherein the external conductor is removed generating an impedance break, said removed portions being regularly positioned along said line at intervals corresponding to the length of a turn, said coil forming a regular helix around a straight cylinder and said portions being aligned parallel to the axis of said cylinder;
   auxiliary current measuring means connected between said ends of said impedance line for measuring the current induced in said impedance line,
   first resistive matching means, connected to the said line ends respectively between said internal and external conductors for preserving said constant characteristic impedance value at said line ends connected to said measuring means, and
   second resistive matching means connected between said internal and external conductors at each of said portions for compensating said impedance break and preserving said constant characteristic impedance value in said portions.

2. A sensor according to claim 1, wherein the second matching means are discrete resistive elements.

3. A sensor according to claim 1, wherein the coil surrounds a magnetic core.

4. A sensor according to claim 1, further comprising shielding means, provided at the location of said portions of said external conductor, for increasing the rejection of the electric field.

5. A sensor according to claim 4, wherein said shield includes a sleeve, surrounding said coaxial cable line at the location of each said portion, and a metal screen forming a low impedance conductor for grounding said sleeves and which makes it possible to connect said sleeves to said external conductor at points diametrically opposite to those of the connection to said sleeve.

6. A sensor according to claim 1, wherein said line is a strip line formed from a double-faced, flexible printed circuit, bent into a cylinder so that edges of said circuit face one another, said circuit having inner turns and an outer earth plane, a space being provided between said edges, with conductor elements ensuring the electrical continuity of said turns in said space.

7. A sensor according to claim 1, wherein said line is a strip line formed from a rigid cylindrical tube made from a dielectric material and externally metallized to form the external conductor, and having a machined slot in order to obtain said portions, the turns being obtained by machining an internal metal coating.

* * * * *